United States Patent [19]

Kemmer

[11] 4,442,592

[45] Apr. 17, 1984

[54] PASSIVATED SEMICONDUCTOR PN JUNCTION OF HIGH ELECTRIC STRENGTH AND PROCESS FOR THE PRODUCTION THEREOF

[76] Inventor: Josef Kemmer, No. 41 D, Hauptstrasse, 8041 Haimhausen, Fed. Rep. of Germany

[21] Appl. No.: 225,069

[22] Filed: Jan. 14, 1981

[30] Foreign Application Priority Data

Jan. 31, 1980 [DE] Fed. Rep. of Germany ....... 3003391

[51] Int. Cl.³ ........................................... H01L 31/18
[52] U.S. Cl. .................................. 29/572; 29/576 B; 29/578; 148/1.5; 148/187
[58] Field of Search .................... 148/1.5, 187; 29/571, 29/572, 569 R, 576 B, 578; 156/643, 662

[56] References Cited

U.S. PATENT DOCUMENTS 3,769,109 10/1973 MacRae et al. ................ 148/1.5 X
3,891,468 6/1975 Ito et al. .............................. 148/1.5

Primary Examiner—Brian E. Hearn
Assistant Examiner—David A. Hey
Attorney, Agent, or Firm—John C. Smith, Jr.

[57] ABSTRACT

A passivated semiconductor pn junction is provided which has a high electric strength, one area being heavily doped and being very thin, in particular for radiation detectors. The pn junction has an edge zone at which a depletion zone (surface channel) is provided underneath the passivation layer.

12 Claims, 2 Drawing Figures

A OXIDE PASSIVATION OF 2,000Å THICKNESS

B OPENING OF THE 10×10 mm² WINDOWS

C ETCHING OF THE STEPS EACH 1,000Å HIGH

D IMPLANTATION
BORON: 15 KeV
$5 \times 10^{14}$ cm$^{-2}$
ARSENIC: 30 KeV
$5 \times 10^{15}$ cm$^{-2}$

E ACTIVATION BY HEAT TREATMENT AT 600°C

F BONDING BY MEANS OF ALUMINUM

A OXIDE PASSIVATION OF 2,000Å THICKNESS

B OPENING OF THE 10×10 mm² WINDOWS

C ETCHING OF THE STEPS EACH 1,000Å HIGH

D IMPLANTATION
BORON : 15 KeV
$5 \times 10^{14}$ cm$^{-2}$
ARSENIC : 30 KeV
$5 \times 10^{15}$ cm$^{-2}$

E ACTIVATION BY HEAT TREATMENT AT 600°C

F BONDING BY MEANS OF ALUMINUM

PASSIVATED SEMICONDUCTOR PN JUNCTION OF HIGH ELECTRIC STRENGTH AND PROCESS FOR THE PRODUCTION THEREOF

BACKGROUND OF THE INVENTION

This invention relates to a passivated semiconductor pn junction which has a high electric strength, one area being heavily doped and being very thin, in particular for radiation detectors, and to a process for its production.

Passivated pn junctions for radiation detectors have already been described in the German Offenlegungsschrift No. 26 55 685.4 and the German Offenlegungsschrift No. 26 49 078.8-33 by the applicant.

Amongst the technological processes for the production of pn structures in Si, doping by diffusion and doping by ion implantation are of particular importance. In particular with the aid of the implantation technique, doping profiles of the most diverse structures can be obtained. The so-called flat pn junctions, which are required particularly in the manufacture of optical detectors and nuclear radiation detectors, are of great importance.

These pn junctions in most cases have a large surface area and, as a rule, have strongly asymmetric doping which is as abrupt as possible. The spacecharge region, which serves for detecting the radiation, extends almost exclusively into the semiconductor with low doping. The heavily doped part of the pn junction, which is made as thin as possible (about 0.1 $\mu$m) in order to avoid absorption losses, serves as the entrance window for the radiation. In the case of radiation of short range, such as, for example, corpuscular radiation, passivation of the entrance window by $SiO_2$ or $Si_3N_4$ is in general not permissible. Such a passivation extends merely over the edge zone and serves to effect a reduction in surface currents or a stabilization against influences of the surroundings.

When the known planar technique is used, these pn junctions are produced, after the photolithographic opening of windows in the passivated semiconductor, by diffusion or by ion implantation. The breakdown voltages of such pn junctions are influenced inter alia by the radius of curvature in the edge zone of the doped layers.

In the case of diffusion, in contrast to the implantation technique, extensive doping is achieved also underneath the protective passivation layer. In this way a greater radius of curvature is obtained, which allows higher operating voltages. In pn structures obtained by flat diffusion, however, as in the case of doping by ion implantation, the radius of curvature of the edge zone is extremely small, and this leads to high local field strengths and hence to low breakdown voltages.

An enhancement channel between the protective layer and the semiconductor located underneath (surface enhancement channel) has an additional negative influence on the breakdown voltages. As a rule, this state is always obtained when n-Si of (111) orientation is passivated with thermally generated $SiO_2$.

If, however, a surface depletion channel is present, the latter leads to a lowering of the edge field strengths, that is to say to higher breakdown voltages.

SUMMARY OF THE INVENTION

It is, therefore, the object of the present invention to increase the electric strength of passivated semiconductor pn junctions, in which one zone is heavily doped and is very thin, by technological measures in a particularly simple and reliable manner.

To attain this object, the present invention provides on the one hand a passivated semiconductor pn junction which has a high electric strength, one area being heavily doped and being very thin, in particular for radiation detectors, characterized in that the pn junction has an edge zone at which a depletion zone (surface channel) is provided underneath the passivation layer. On the other hand, the invention provides a process for the production of a semiconductor pn junction comprising the steps of providing a passivating layer or a masking layer of a material selected from the group consisting of $SiO_2$, $Si_3N_4$, metal films, photosensitive resists, and combinations thereof, with zones of reduced thickness at the window edge of the pn junction, and effecting doping of the surface channel through the zones of reduced thickness. As a result, the protective action of the passivating layer against doping is reduced at the step, and doping of the channel, simultaneously with or independently of the production of the pn junction, at the edge around the pn junction is made possible.

The channel doping can be carried out simultaneously with the production of the pn structure, that is to say no additional steps are necessary. Finally, a wedge-shaped or stepped reduction in the thickness of the passivating layer around the window can very readily be produced by known technologies, such as oxide passivation or nitride passivation, photolithography, ion etching, or plasma etching, simultaneously with or after the opening of the windows.

Alternatively, the doping of the pn junction and channel may be carried out separately. For example, the doping of the pn junction may be carried by diffusion and doping of the channel may be carried out by ion implantation.

A further essential advantage of limiting the channel doping to a narrow edge zone around the pn junction is the fact that the capacitance and the off-state or inverse current of the pn element increase only slightly. The channel doping prevents influences of the surroundings on the edge zone of the pn junction and therefore leads to a greater stability of the pn junction.

BRIEF DESCRIPTION OF THE DRAWINGS

An embodiment of the invention will now be described by way of example and with reference to the accompanying schematic drawings, in which.

DESCRIPTION OF THE PREFERRED EMBODIMENT

The embodiment shown in FIGS. 1A-F concerns the production of nuclear radiation detectors with the aid of the planar technique, using ion implantation.

Figure 1:
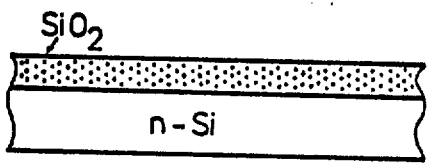
FIGS. 1A-F show diagrammatically the steps of producing nuclear radiation detectors in accordance with the present invention.
Figure 1:
Figure 1:
Figure 1:
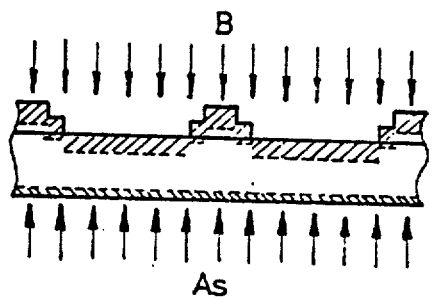
Figure 1:
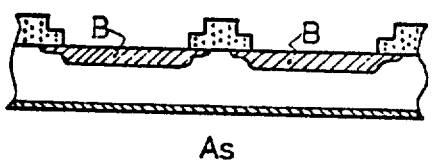
Figure 1:
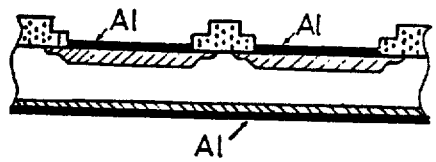

The starting materials used are n-Si slices having a specific resistance of 2 K$\Omega$ cm and a charge carrier life of about 1 msec. The Si slices are cut perpendicular to the (111) axis. The slice diameter is 50.8 mm and the thickness is 300 $\mu$m. The polished, cleaned slices are first provided by thermal oxidation with an $SiO_2$ protective layer of 2,000 Å thickness (FIG. 1A). Windows of 10×10 mm² area are then opened in the oxide by a photolithographic step (FIG. 1B). Each chip is now surrounded by an SiO₂ edge of 1.5 mm width for surface passivation. Steps of 1,000 Å thickness and 100 μm width are then etched into the SiO₂ edge in a second photolithographic step (FIG. 1C). The front of the slice is then re-doped in the windows by implantation with boron (FIG. 1D).

The passivating SiO₂ protects the Si, located underneath, from undesired doping outside the windows. The energy and dose of the boron ions, at 15 KeV and $5 \times 10^{14}$ cm$^{-2}$ respectively, are such that a certain fraction penetrates through the step and controlled redoping of the channel becomes possible. The rear of the slices is implanted with arsenic at 30 KeV and a dose of $5 \times 10^{15}$ cm$^{-2}$. The samples are then heat-treated at 600° C. (FIG. 1E) and metallized with aluminum (FIG. 1F). After the slices have been cut up, the chips are ready for assembly.

Detector chips which have both a high electric strength and extremely low off-state or inverse currents can be produced by this process. Their properties as detectors for alpha-radiation or beta-radiation are hitherto unsurpassed.

Figure 2:
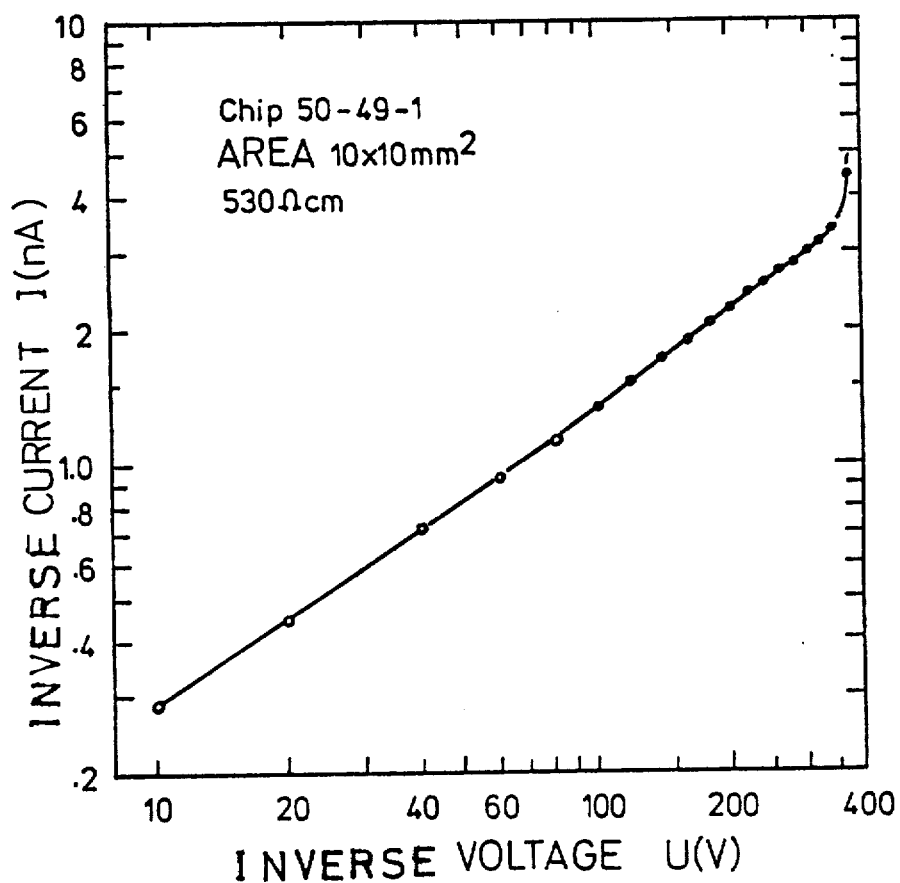
FIG. 2 shows a typical current-voltage characteristic of a detector chip.

FIG. 2 shows a typical current-voltage characteristic of such a chip. Since breakdowns at the pn junction are avoided, a rise in current takes place only as a result of an injection of charge carriers when the space-charge zone reaches the rear contact.

Doping by ion implantation is preferred for the production of the radiation detectors according to the invention, since it does not require a high-temperature process and makes it possible to produce very thin, heavily doped zones.

The invention may be embodied in other specific forms without departing from the spirit or essential characteristics thereof. The embodiment is therefore to be considered in all respects as illutrative and not restrictive.

What is claimed is:

1. A process for the production of a detector chip for detecting radiation and having a semi-conductor pn junction, comprising the steps of:
   (a) applying a passivating layer of predetermined thickness to a surface on an n-Si slice for surface passivation of said n-Si slice;
   (b) removing a portion of said passivating layer from said surface of said n-Si slice to form a window surrounded by an edge of said passivating layer;
   (c) forming a step portion of said edge of said passivating layer about said window; and
   (d) implanting a doping material in said n-Si slice within said window and, through said step portion, the portion of said n-Si slice beneath said step portion of said passivating layer surrounding said window;
   (e) said step portion having a substantially uniform thickness less than said determined thickness of the remaining portion of said passivating layer, said thickness of said step portion being such that a predetermined fraction of the doping material implanted in the surface of said n-Si slice within said window is implanted in said surface of said n-Si slice beneath said step portion;
   (f) whereby the peripheral portion of the doped surface of said n-Si slice beneath said step portion of said passivating layer has a uniform doping concentration and thickness across its entire width which thickness is a fraction of the thickness of the doped surface portion within said peripheral portion and said fraction of said doping material penetrating said step portion being sufficient to compensate the accumulated charge in the surface channel beneath said step portion, thus enabling a depletion channel beneath said step portion.

2. A process according to claim 1 wherein said doping material comprises boron ions.

3. A process according to claim 2 wherein said passivating layer comprises a material selected from the group consisting of SiO₂, Si₃N₄, metal films, photosensitive resists and combinations thereof.

4. A process according to claim 3 wherein said passivating layer has a thickness of about 2000 Å.

5. A process according to claim 4 wherein the thickness of said step portion of said passivating layer is about 1000 Å.

6. A process according to claim 5 wherein the width of said step portion of said passivating layer is about 100 μm.

7. A process according to claim 6 wherein the energy and dose of said boron ions during implantation are 15 KeV and $5 \times 10^{14}$ cm$^{-2}$, respectively.

8. A process according to claim 3 comprising the further steps of implanting the surface of said n-Si slice opposite said one surface with arsenic ions, heating said n-Si slice to an activating temperature, and applying bonding layers of aluminum to both said one surface of said n-Si slice within said window and said other surface of said n-Si slice.

9. A process according to claim 3 wherein said n-Si slice is heated to an activation temperature of about 600° C.

10. A process according to claim 1 wherein said step portion in said edge of said passivating layer about said window is formed by means of photolithography.

11. A process according to claim 1 wherein said step portion in said edge of said passivating layer about said window is formed by means of plasma etching.

12. A process according to claim 1 wherein said step portion in said edge of said passivating layer about said window is formed by means of ion etching.

* * * * *